United States Patent [19]

Yarman

[11] Patent Number: 4,603,310
[45] Date of Patent: Jul. 29, 1986

[54] T-SECTION DIGITAL PHASE SHIFTER APPARATUS

[75] Inventor: Binboga S. Yarman, Çengelköy, Turkey

[73] Assignee: The United States of America as represented by the Secretary of the Air Force, Washington, D.C.

[21] Appl. No.: 767,454

[22] Filed: Aug. 20, 1985

[51] Int. Cl.$^4$ .................. H03H 7/20; H01P 1/185
[52] U.S. Cl. .................. 333/139; 307/320; 307/606; 333/161; 333/164
[58] Field of Search .................. 333/17 L, 17 R, 23, 333/28 R, 138–140, 156, 161, 164; 332/30 R, 30 V; 307/317 R, 317 A, 320, 511–512, 595, 596, 606

[56] References Cited

U.S. PATENT DOCUMENTS

| | | | |
|---|---|---|---|
| 3,196,368 | 12/1961 | Potter | 333/138 |
| 3,718,873 | 2/1973 | Garver | 333/164 |
| 3,778,733 | 12/1973 | Rizzi | 333/139 |
| 4,225,367 | 6/1981 | Gaglione et al. | 333/164 |
| 4,255,724 | 3/1981 | Bergero | 333/17 L |

OTHER PUBLICATIONS

"Broad-Band Diode Phase Shifters," by R. V. Garver, in IEEE Transactions on Microwave Theory and Techniques, vol. MTT-20, No. 5, May 1972, pp. 314–323.
"Simplified Switched Line Phase Shifter," by A. Schwarzmann, in DEP Symposium on MIC's, May 1971.

Primary Examiner—Marvin L. Nussbaum
Attorney, Agent, or Firm—Donald J. Singer; William Stepanishen

[57] ABSTRACT

An extra high frequency T-section digital phase shifter apparatus having a pair of back to back diodes connected between the input and output terminals with a parallel circuit connected between the common junction and ground. The shunt parallel circuit has an inductor in parallel with the series combination of a capacitor and a diode to provide a balanced insertion loss at each diode switching state. When the diodes are in the forward-biased state they act as closed short circuit switches and in the shunt circuit, the inductance resonates with the diode capacitance to provide a perfect transmission for the RF signal.

8 Claims, 3 Drawing Figures

T-SECTION DIGITAL PHASE SHIFTER APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a phase shifter apparatus, and in particular to a T-section digital phase shifter apparatus.

In modern high frequency radar and communication systems, the antenna pattern must be moved at very rapid rates and this is normally achieved in array antennas through the use of a matrix of small radiator elements whose radiation phases are systematically and electronically varied. The necessary phase gradients across the antenna are usually generated in discrete steps by a plurality of such electronic phase shifter elements.

A major handicap in the prior art phase shifter elements has been in the inability to exactly reproduce the diodes upon which the characteristics of the diode phase shifter elements are significantly dependent. However, this problem has been essentially solved by semiconductor manufacturers, so that attention has turned to the improvement of the phase shifter elements themselves. The design of the present phase shifter elements permits it beneficially to be physically smaller than the conventional elements of the loaded transmission line type.

In the military market, there is an increasing demand to design monolithic-digital phase shifters with very low insertion loss requirements. As the frequency increases, the insertion loss requirements become difficult to meet. Recent advances in the art have produced a 4-Bit monolithic digital phase shifter which uses conventional design approaches but only achieves about 5 dB insertion loss at 10 GHz which is excessively large for most military applications. Clearly, there is a need for new techniques in designing monolithic digital phase shifters with low insertion loss at high frequencies (X-Band and above). In the present invention, a T-section digital phase shifter suitable for extra high frequency applications with low loss and excellent phase tracking capability (i.e. wide bandwidth) is presented. The T-section digital phase shifter can easily be implemented as a monolithic circuit on many available substrates, such as, Si, GaAs, GaInAs, InP, etc.

SUMMARY OF THE INVENTION

The present invention utilizes a pair of diodes which are connected back to back between the input and output of the circuit. A parallel resonant circuit which is comprised of an inductor in parallel with a capacitor that is in series with a diode, is arranged in a T configuration at the common junction between the back to back diodes. The T-section digital phase shifter apparatus exhibits easy practical implementation with balanced insertion loss at each diode switching state. Therefore, it will find wide application in the extra high frequency military communication, system design.

It is one object of the present invention, therefore, to provide an improved extra high frequency T-section digital phase shifter apparatus.

It is another object of the invention to provide an improved extra high frequency T-section digital phase shifter apparatus wherein the resonant circuit comprises an inductor in parallel with a capacitor which is in series with a diode.

It is yet another object of the invention to provide an improved extra high frequency T-section digital phase shifter apparatus wherein the parallel combination of an inductor and a capacitor in series with a diode is arranged between the common junction of the back to back diode combination to common input/output line.

It is still another object of the invention to provide an improved extra high frequency T-section digital phase shifter apparatus wherein the insertion loss of the phase shift circuit is balance for each diode conducting state.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
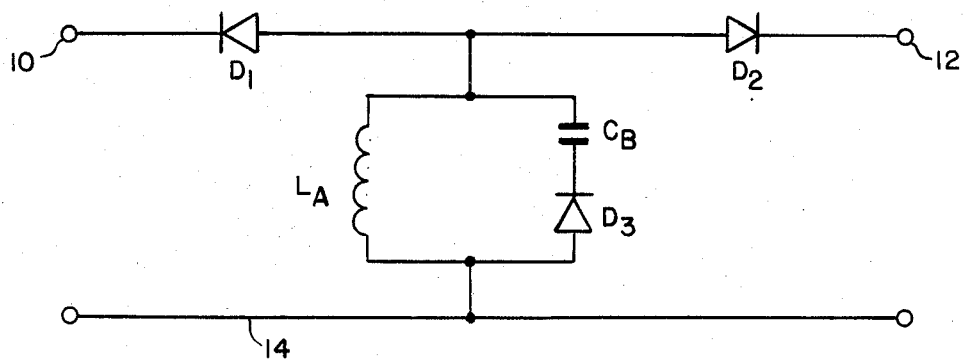
FIG. 1 is a schematic diagram of the extra high frequency T-section digital phase shifter apparatus according to the present invention.

Turning now to FIG. 1, there is shown an extra high frequency T-section digital phase shifter apparatus according to the preferred embodiment of the present invention. The T-section digital phase shifter apparatus comprises a pair of back to back diodes D1, D2 which are connected between the input and output terminals 10, 12. A shunt circuit which comprises an inductor $L_A$ in parallel with the series combination of capacitor $C_B$ and diode D3 is connected between the common junction of the back to back diode combination to a common input/output line 14. It should be noted that in FIG. 1, the diodes D1, D2 are identical and may be planar pin diodes in a series configuration. The diode D3 may have identical electric and physical characteristics as the diodes D1 and D2, however, it could be either a planar or a mesa pin diode in the shunt configuration.

Figure 2:
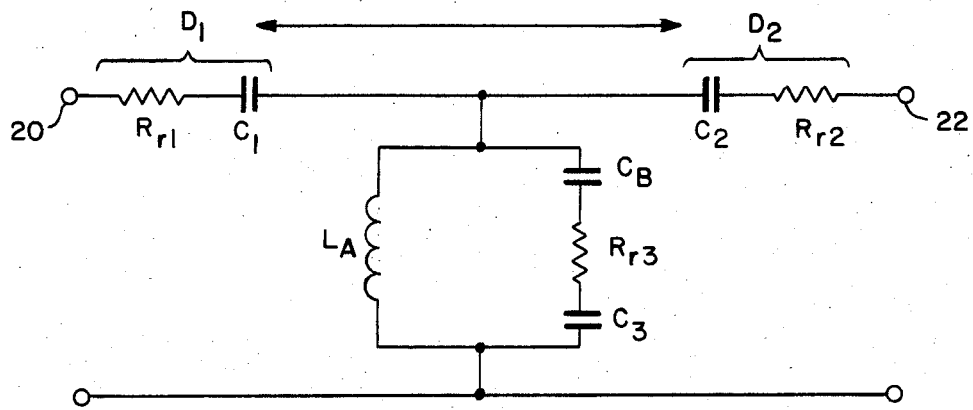
FIG. 2 is a schematic diagram of the extra high frequency T-section digital phase shifter apparatus in which the diodes are reversed-biased, and, FIG. 3 is a schematic diagram of the extra high frequency T-section digital phase shifter apparatus in which the diodes are forward-biased.
Figure 3:
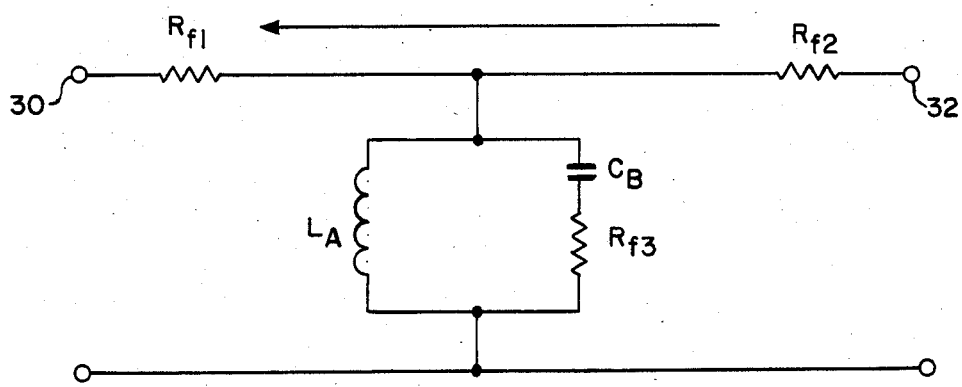

The operation of the extra high frequency T-section digital phase shifter apparatus will be better understood when the following description is taken in conjunction with FIGS. 2 and 3. In FIG. 2 there is shown the equivalent schematic diagram of the extra high frequency T-section digital phase shifter apparatus in which the diodes D1 through D3 of FIG. 1 are reversed-biased (BIT-OUT-State). When the diodes D1, D2 are reversed-biased (BIT-OUT-State), the series circuit from the input 20 to the output 22 comprises the series combination of the reversed-biased equivalents of the diodes D1, D2 which are respectively resistances $R_{r1}$, $R_{r2}$ and the capacitors $C_{D1}$, $C_{D2}$. In the reversed-biased mode, the shunt circuit branch reduces to the parallel combination of the inductor $L_A$ in the series with the equivalent circuit elements of diode D3 which are resistor $R_{r3}$ and capacitor $C_3$ and the capacitor $C_B$.

When the diodes D1, D2 and D3 are reversed biased (BIT-IN STATE), they act as the capacitors $C_1$, $C_2$, $C_3$ with a small series reverse resistance $R_{r1}$, $R_{r2}$, $R_{r3}$. In this state, the reactive circuit elements capacitors $C_1$ through $C_3$, and $C_A$, and the inductor $L_A$ are computed in such a way that the desired phase shift $\Delta\phi$ is achieved with no transmission loss at the center frequency, $f_o$ of the passband.

The element values of the T-section digital phase shifter apparatus can be computed using the following design equations:

$$\eta = \tan\left(\frac{\pi}{4} - \Delta\phi\right) \quad (1)$$

$$C = \eta + \sqrt{\eta^2 + 1} \quad (2)$$

$$L = \frac{1 + C^2}{2C} \quad (3)$$

$$C_B = \frac{1 + \sqrt{1 + 4CL}}{2L} \quad (4)$$

$$L_A = \frac{1}{C_B} \quad (5)$$

where $\Delta\phi$ is the desired phase shift which is specified as a design parameter. The element values for the capacitors C, $C_B$ and the and inductor $L_A$ are all normalized with respect to center frequency $f_o$ and the resistor $R_o$ which is specified as the normalization number (generally $R_o = 50\Omega$). The value of capacitor C in the Equations (2) and (3) is equal to the value of capacitors $C_1$ through $C_3$ respectively.

Referring now to FIG. 3, there is shown the equivalent schematic diagram of the extra high frequency T-section digital phase shifter apparatus wherein the diodes D1, D2 and D3 of FIG. 1 are forward-biased (BIT-IN-State). When the diodes D1 and D2 are forward-biased, the series circuit from the input 30 to the output 32 comprises the forward resistance, $R_{f1}$ of the diode D1 in series with the forward resistance $R_{f2}$ of the diode D2.

When the diodes D1, D2 and D3 are forward biased (BIT-OUT-State), they act as closed circuit switches with a small series resistance $R_f$ (FIG. 3), and in the shunt branch, the inductance $L_A$ resonates with the capacitor $C_B$ providing a perfect transmission for the RF signal. Thus, the T-section digital phase shifter is perfectly matched at the center frequency $f_o$ for both BIT-IN and BIT-OUT states. Therefore, there is no intrinsic mismatch loss associated with the design technique of the extra high frequency T-section digital phase shifter apparatus at the center frequency, $f_o$. However, the small losses due to practical realization of the circuit elements are inevitable.

The extra high frequency T-section phase shifter apparatus which is shown in FIG. 1 can be implemented either with discrete components or as a monolithic chip. The diodes D1, D2 and D3 should be fabricated such that when they are reversed biased, they yield the desired actual capacitance $\hat{C}$, which is defined by the equation:

$$\hat{C} = \frac{C}{2\pi f_o R_o},$$

where the capacitor C is defined by Equation (2).

The lumped capacitor $\hat{C}_B$ is defined as:

$$\hat{C}_B = \frac{C_B}{2\pi f_o R_o}$$

where the capacitor $C_B$ is defined by Equation (4), and is realized as a layer structure.

The inductance $L_A$ is defined as:

$$\hat{L}_A = \frac{L_A}{2\pi f_o} R_o,$$

where $L_A$ is defined by Equation (5), may be fabricated as open or shunt stub transmission line for monolithic approach or as a piece of bond wire for discrete approach. The DC Biasing of the diodes is conventional.

Although the invention has been described with reference to a particular embodiment, it will be understood to those skilled in the art that the invention is capable of a variety of alternative embodiments within the spirit and scope of the appended claims.

What is claimed is:

1. An extra high frequency T-section digital phase shifter apparatus comprising in combination:
    a first and second diode means connected back to back to form a series circuit with a first common junction therebetween, the cathode of said first diode means forming an input terminal for an Rf signal, the cathode of said second diode means forming an output terminal, said first and second diode means having a first and second state,
    a shunt circuit comprising a first inductor means in parallel with first capacitor means which is in series with a third diode means, one end of said third inductor means connected to one end of said first capacitor means to form a second common junction, said second common junction connected to said first common junction between said first and second diode means, the other end of said first inductor means connected to one end of said third diode means to form a third common junction, said third common junction connected to ground, said third diode means having a first and second state.

2. An extra high frequency T-section digital phase shifter apparatus as described in claim 1 wherein said first, second and third diodes means are identical.

3. An extra high frequency T-section digital phase shifter apparatus as described in claim 2 wherein said first state of said first, second and third diode means is the forward-biased state and said second state of said first, second and third diode means is the reverse-biased state.

4. A extra high frequency T-section digital phase shifter apparatus as described in claim 3 wherein the insertion loss of said digital phase shifter apparatus at both said first and second state of said first, second and third diode means is perfectly matched.

5. A extra high frequency T-section digital phase shifter apparatus as described in claim 3 wherein said first, second and third diode means in said first state each respectively comprise a small forward resistance, $R_f$.

6. A extra high frequency T-section digital phase shifter apparatus as described in claim 3 wherein said first, second and third diode means in said second state each respectively comprise a capacitance, $C_D$ and a reverse resistance, $R_r$.

7. An extra high frequency T-section digital phase shifter apparatus as described in claim 5 wherein said series circuit between said input and output terminal comprises a first forward resistor $R_{f1}$ in series with a second forward resistor $R_{f2}$, and, said shunt circuit comprises said first inductor means in parallel with the series combination of said first capacitor means and a third forward resistance $R_{f3}$.

8. An extra high frequency T-section digital phase shifter apparatus as described in claim 6 wherein when said first, second and third diode means are in said second state said series circuit between said input and output terminal comprises a first capacitor $C_{D1}$ in series with a first reverse resistor $R_{r1}$, and a second capacitor $C_{D2}$ in series with a second reverse resistor $R_{r3}$, and, said shunt circuit comprises said first inductor means in parallel with the series combination of said first capacitor means, a third reverse resistor $R_{r3}$, and a third capacitor $C_{D3}$.

* * * * *